US010630058B2

(12) United States Patent
Hashimoto

(10) Patent No.: US 10,630,058 B2
(45) Date of Patent: Apr. 21, 2020

(54) QUANTUM CASCADE LASER

(71) Applicant: SUMITOMO ELECTRIC INDUSTRIES, LTD., Osaka (JP)

(72) Inventor: Jun-ichi Hashimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/297,215

(22) Filed: Mar. 8, 2019

(65) Prior Publication Data
US 2019/0334320 A1 Oct. 31, 2019

(30) Foreign Application Priority Data

Apr. 26, 2018 (JP) .................................. 2018-085355

(51) Int. Cl.
| | | |
|---|---|---|
| *H01S 5/00* | (2006.01) | |
| *H01S 5/34* | (2006.01) | |
| *H01S 5/22* | (2006.01) | |
| *H01S 5/125* | (2006.01) | |

(Continued)

(52) U.S. Cl.
CPC .......... *H01S 5/3402* (2013.01); *H01S 5/0425* (2013.01); *H01S 5/04254* (2019.08); *H01S 5/04256* (2019.08); *H01S 5/125* (2013.01); *H01S 5/22* (2013.01); *H01S 5/3401* (2013.01); *H01S 5/34313* (2013.01); *H01S 5/2206* (2013.01); *H01S 5/34306* (2013.01)

(58) Field of Classification Search
CPC ...... H01S 5/3402; H01S 5/0425; H01S 5/125; H01S 5/22; H01S 5/34313; H01S 5/04254; H01S 5/04256; H01S 5/2206; H01S 5/34306; H01S 5/3401
See application file for complete search history.

(56) References Cited

U.S. PATENT DOCUMENTS

| | | | |
|---|---|---|---|
| 2011/0073838 A1* | 3/2011 | Khan | H01L 27/153 257/13 |
| 2016/0293713 A1* | 10/2016 | Nechay | H01L 29/7851 |
| 2018/0166860 A1* | 6/2018 | Hashimoto | H01S 5/3402 |

(Continued)

OTHER PUBLICATIONS

Thierry Aellen, et al., Continuous-wave distributed-feedback quantum-cascade lasers on a Peltier cooler, *Applied Physics Letters*. vol. 83, pp. 1929-1931, 2003.

*Primary Examiner* — Kinam Park
(74) *Attorney, Agent, or Firm* — Smith, Gambrell & Russell, LLP.

(57) ABSTRACT

A quantum cascade laser having a laser structure that includes a semiconductor mesa, a first end surface, a second end surface, and a first electrode provided on the semiconductor mesa. The laser structure includes a first region having the first end surface and a second region located between the second end surface and the first region. The semiconductor mesa includes a first mesa portion and a second mesa portion that are respectively included in the first region and the second region. The semiconductor mesa includes a first superlattice layer, a second superlattice layer, and a conductive semiconductor region. The first superlattice layer extends from the first end surface in the second axis direction and is included in the first mesa portion and the second mesa portion, and the second superlattice layer is provided in one of the first mesa portion and the second mesa portion.

9 Claims, 10 Drawing Sheets

(51) Int. Cl.
 *H01S 5/343* (2006.01)
 *H01S 5/042* (2006.01)

(56) References Cited

U.S. PATENT DOCUMENTS

2018/0261981 A1* 9/2018 Katsuyama ......... H01S 5/34346
2018/0261982 A1* 9/2018 Katsuyama ........... H01S 5/3408
2019/0305519 A1* 10/2019 Hashimoto ........... H01S 5/3402

* cited by examiner

QUANTUM CASCADE LASER

BACKGROUND OF THE INVENTION

1. Field of the Invention

The present invention relates to a quantum cascade laser.

2. Description of the Related Art

A quantum cascade laser is disclosed in Non-Patent Document 1 (Applied Physics Letters, vol. 83, pp. 1929-1931, 2003).

SUMMARY OF THE INVENTION

A quantum cascade laser includes a semiconductor mesa, an emitting end surface, and a reflecting end surface. The semiconductor mesa extends in a direction from the emitting end surface toward the reflecting end surface. A structure in which a current distribution can occur in the semiconductor mesa is advantageous in terms of giving diversity to device characteristics. More specifically, in this device structure, the current density in the vicinity of the emitting end surface and/or the reflecting end surface can be substantially changed from the current density at a position in an interior that is spaced apart from the emitting end surface and the reflecting end surface.

Accordingly, it is preferable to provide a quantum cascade laser having a structure in which enables to change a current distribution in a semiconductor mesa.

A quantum cascade laser according to one aspect of the present invention includes a laser structure that includes a substrate and a semiconductor mesa arranged in a first axis direction and that has a first end surface and a second end surface arranged in a second axis direction crossing in the first axis direction and a first electrode that is provided on the semiconductor mesa. The laser structure includes a first region that includes the first end surface and a second region that is located between the second end surface and the first region. The semiconductor mesa includes a first mesa portion and a second mesa portion that are respectively included in the first region and the second region. The semiconductor mesa includes a first superlattice layer, a second superlattice layer, and a conductive semiconductor region. The first superlattice layer extends from the first end surface in the second axis direction and is included in the first mesa portion and the second mesa portion, and the second superlattice layer is provided in one of the first mesa portion and the second mesa portion. The first superlattice layer includes an array of unit cells that provides a subband, and the second superlattice layer includes an array of unit cells that provides a subband.

A preferable embodiment of the present invention will be described in detail below with reference to the accompanying drawings to easily clarify the above-mentioned object and other objects of the present invention and features and advantages of the present invention.

DESCRIPTION OF THE PREFERRED EMBODIMENTS

Figure 1:
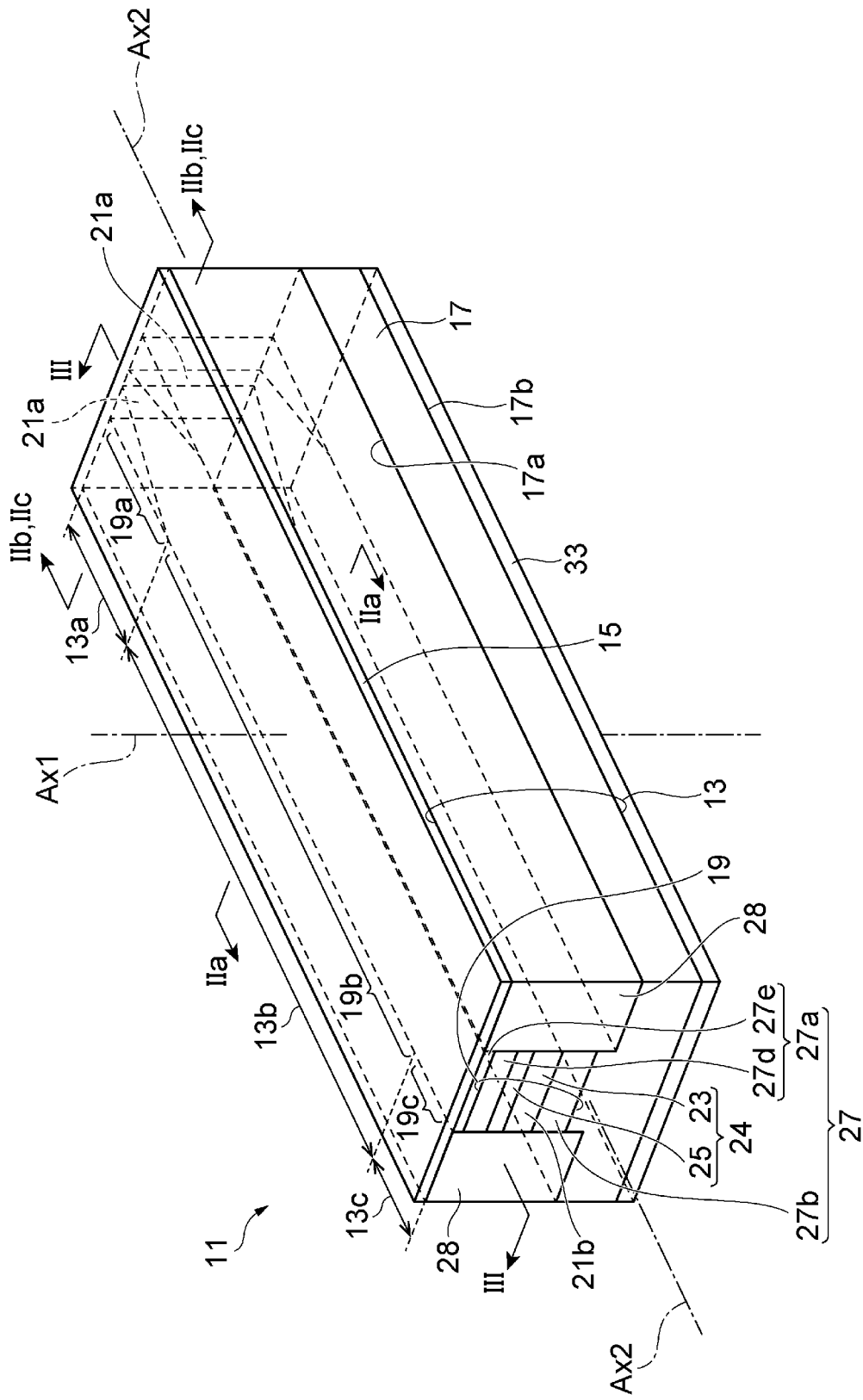
FIG. 1 is a perspective view schematically illustrating a quantum cascade laser according to an embodiment of the present invention.

Several specific examples will now be described.

A quantum cascade laser according to a specific example includes (a) a laser structure that includes a substrate and a semiconductor mesa arranged in a first axis direction and that has a first end surface and a second end surface arranged in a second axis direction crossing in the first axis direction and (b) a first electrode that is provided on the semiconductor mesa. The laser structure includes a first region that includes the first end surface and a second region that is located between the second end surface and the first region. The semiconductor mesa includes a first mesa portion and a second mesa portion that are respectively included in the first region and the second region. The semiconductor mesa includes a first superlattice layer, a second superlattice layer, and a conductive semiconductor region. The first superlattice layer extends from the first end surface in the second axis direction and is included in the first mesa portion and the second mesa portion, and the second superlattice layer is provided in one of the first mesa portion and the second mesa portion. The first superlattice layer includes an array of unit cells that provides a subband, and the second superlattice layer includes an array of unit cells that provides a subband.

In the quantum cascade laser, a current flows through the semiconductor mesa. The first superlattice layer is included in both the first mesa portion and the second mesa portion, and the second superlattice layer is included in one of the first mesa portion and the second mesa portion. In an operation of the quantum cascade laser, a turn-on voltage (a voltage at which laser oscillation occurs) in a mesa portion that does not include the second superlattice layer is different from a turn-on voltage in a mesa portion that includes the second superlattice layer.

In the quantum cascade laser according to the specific example, the second superlattice layer is provided in the first mesa portion and reaches the first end surface.

According to the quantum cascade laser, the first superlattice layer and the second superlattice layer reach the first end surface, and the amount of current leakage related to the first end surface is reduced.

In the quantum cascade laser according to the specific example, the first electrode includes an end portion that is spaced apart from the first end surface.

According to the quantum cascade laser, the current density in the vicinity of the first end surface is reduced by setting back the first electrode.

The quantum cascade laser according to the specific example further includes a second electrode that is connected to the substrate of the laser structure, and the second electrode includes an end portion that is spaced apart from the first end surface.

According to the quantum cascade laser, the current density in the vicinity of the first end surface is reduced by setting back the second electrode.

In the quantum cascade laser according to the specific example, the first superlattice layer and the second superlattice layer are arranged so as to be in contact with each other in the first axis direction.

According to the quantum cascade laser, as a result of the first superlattice layer and the second superlattice layer being in contact with each other, the sum of the numbers of laminated layers of the first superlattice layer and the second superlattice layer can be provided to a core layer.

In the quantum cascade laser according to the specific example, the first superlattice layer is spaced apart from the second superlattice layer in the first axis direction.

According to the quantum cascade laser, as a result of the first superlattice layer and the second superlattice layer being spaced apart from each other, continuous growth of the first superlattice layer and the second superlattice layer can be avoided.

In the quantum cascade laser according to the specific example, in the semiconductor mesa, the first mesa portion has a mesa width that decreases in a direction from the second mesa portion toward the first mesa portion.

According to the quantum cascade laser, the current density in the first mesa portion is reduced, since the first mesa portion has the mesa width that decreases in the direction from the second mesa portion toward the first mesa portion.

In the quantum cascade laser according to the specific example, the unit cells of the first superlattice layer include an active layer that enables intersubband transition and an injection layer that injects a carrier into the active layer, and the unit cells of the second superlattice layer are substantially the same as the unit cells of the first superlattice layer.

According to the quantum cascade laser, the first superlattice layer and the second superlattice layer can use unit cells that are substantially the same as each other.

In the quantum cascade laser according to the specific example, the unit cells of the first superlattice layer include an active layer having an aluminum indium arsenide (AlInAs)/gallium indium arsenide (GaInAs) superlattice and an injection layer having an AlInAs/GaInAs superlattice, and the unit cells of the second superlattice layer include an active layer having an AlInAs/GaInAs superlattice and an injection layer having an AlInAs/GaInAs superlattice.

According to the quantum cascade laser, each of the active layer and the injection layer can include an AlInAs/GaInAs superlattice.

The findings of the present invention can be easily understood from the following detailed description, which refers to the accompanying drawings illustrated as examples. A quantum cascade laser according to an embodiment will be described below with reference to the accompanying drawings. Portions that are the same as each other will be denoted by the same reference sign where possible.

Figure 2A:
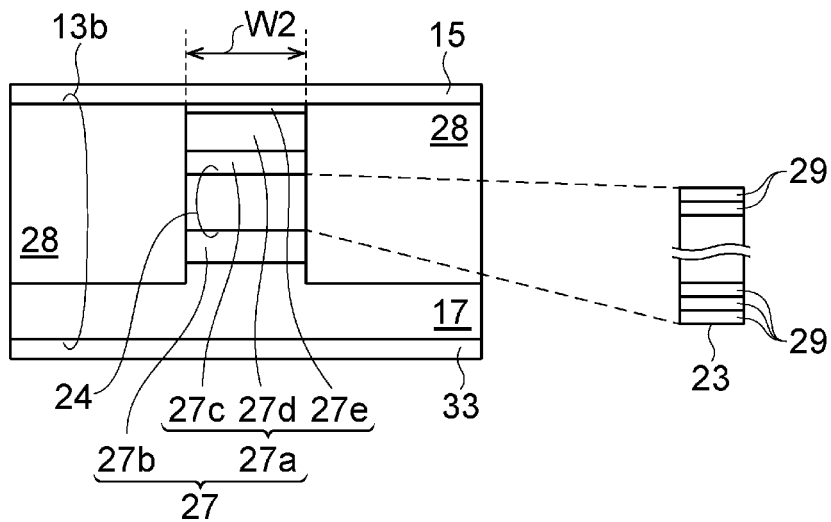
FIG. 2A is a cross-sectional view taken along line IIa-IIa of FIG. 1.
Figure 2B:
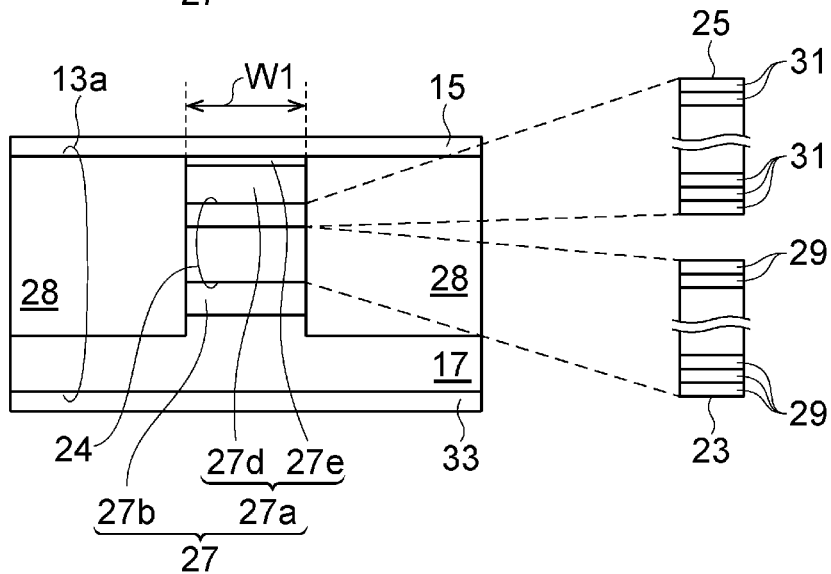
FIG. 2B is a cross-sectional view taken along line IIb-IIb of FIG. 1.
Figure 2C:
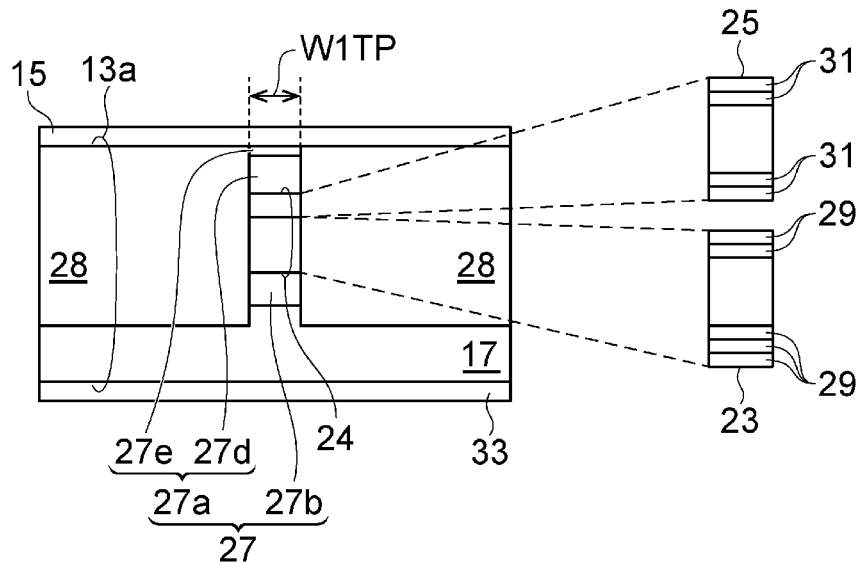
FIG. 2C is a cross-sectional view taken along line IIc-IIc of FIG. 1.
Figure 3:
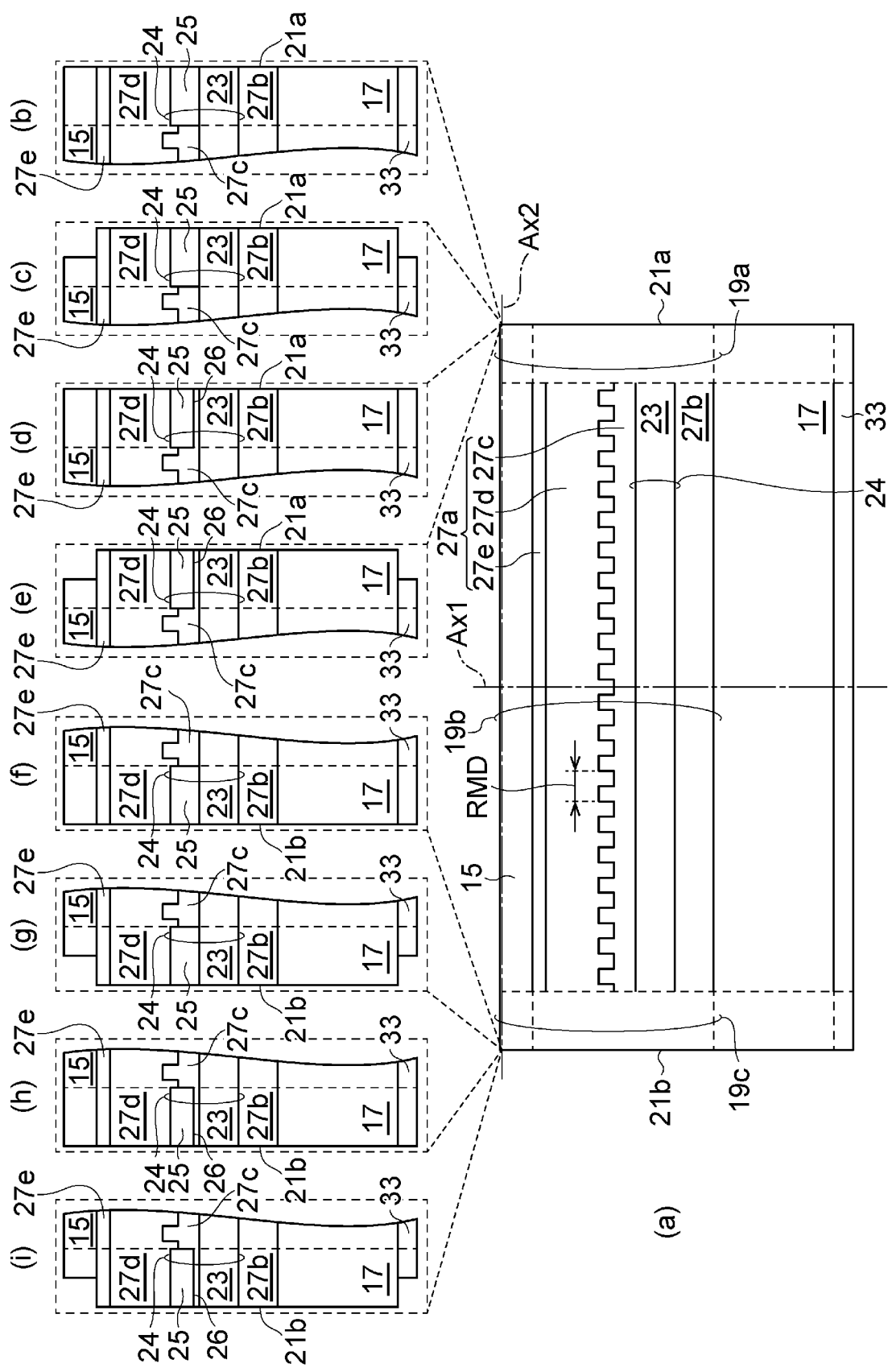
FIG. 3 is a diagram illustrating a structure of the quantum cascade laser according to the embodiment.

FIG. 1 is a perspective view schematically illustrating the quantum cascade laser according to the present embodiment. FIG. 2A is a cross-sectional view taken along line IIa-IIa of FIG. 1. FIGS. 2B and 2C are respectively a cross-sectional view taken along line IIb-IIb of FIG. 1 and a cross-sectional view taken along line IIc-IIc of FIG. 1. A portion (a) of FIG. 3 is a sectional view taken along line of FIG. 1. Portions (b) to (i) of FIG. 3 are diagrams each illustrating a device structure that is applicable to an end portion of the quantum cascade laser according to the present embodiment.

A quantum cascade laser 11 includes a laser structure 13 and a first electrode 15. The laser structure 13 includes a substrate 17 and a semiconductor mesa 19, and the substrate 17 and the semiconductor mesa 19 are arranged in a direction of a first axis Ax1. The semiconductor mesa 19 is mounted on a main surface 17a of the substrate 17. The first electrode 15 is disposed on the semiconductor mesa 19. The laser structure 13 has a first end surface 21a and a second end surface 21b, and the first end surface 21a and the second end surface 21b are arranged in a direction of a second axis Ax2 crossing the direction of the first axis Ax1. The laser structure 13 includes a first region 13a and a second region 13b. The first region 13a includes the first end surface 21a. The second region 13b is located between the second end surface 21b and the first region 13a.

The semiconductor mesa 19 includes a first mesa portion 19a and a second mesa portion 19b, and the first mesa portion 19a and the second mesa portion 19b are located between the first end surface 21a and the second end surface 21b. The first region 13a and the second region 13b include the first mesa portion 19a and the second mesa portion 19b, respectively.

The semiconductor mesa 19 includes a core layer 24 and a conductive semiconductor region 27, and the core layer 24 includes a first superlattice layer 23 and a second superlattice layer 25. The first superlattice layer 23 and the conductive semiconductor region 27 are arranged in the direction of the second axis Ax2 in the first mesa portion 19a and the second mesa portion 19b. The first superlattice layer 23 extends from the first end surface 21a in the direction of the second axis Ax2, and in the present embodiment, the first superlattice layer 23 reaches the second end surface 21b. The second superlattice layer 25 is provided in one of the first mesa portion 19a and the second mesa portion 19b. The first superlattice layer 23 includes an array of unit cells 29 providing subbands, and the second superlattice layer 25 includes an array of unit cells 31 providing subbands.

The quantum cascade laser 11 further includes a second electrode 33, and the second electrode 33 is connected to the laser structure 13. A current from one of the first electrode 15 and the second electrode 33 flows into the other of the first electrode 15 and the second electrode 33 via the semiconductor mesa 19. In the present embodiment, the second electrode 33 is in contact with a rear surface 17b of the substrate 17 of the laser structure 13.

In the first superlattice layer 23, as a result of external voltage having a suitable value being applied thereto, the energy levels of the subbands are aligned in the array of the unit cells 29. As a result, optical transition using the subbands occurs in the first superlattice layer 23. The value of this external voltage will be referred to as a turn-on voltage of the first superlattice layer 23, which is, for example, a first turn-on voltage. A mesa portion (the second mesa portion 19b in the present embodiment) that includes the first superlattice layer 23 and that does not include the second superlattice layer 25 generates light in response to application of a voltage that is equal to or higher than the first turn-on voltage.

The arrangement of the first superlattice layer 23 and the second superlattice layer 25 include the arrays of the unit cells 29 and the unit cells 31. The first turn-on voltage cannot align the energy levels of the subbands in the arrays of the unit cells 29 and the unit cells 31, and as a result, a current cannot flow through with the arrangement of the first superlattice layer 23 and the second superlattice layer 25.

In the quantum cascade laser 11, a current from one of the first electrode 15 and the second electrode 33 flows through the semiconductor mesa 19. The first superlattice layer 23 is included in both the first mesa portion 19a and the second mesa portion 19b, and the second superlattice layer 25 is included in one of the first mesa portion 19a and the second mesa portion 19b. In an operation of the quantum cascade laser 11, the turn-on voltage in a mesa portion that does not include the second superlattice layer 25 is different from the turn-on voltage in a mesa portion that includes the second superlattice layer 25.

The laser structure 13 includes a third region 13c in addition to the first region 13a and the second region 13b. The third region 13c includes the second end surface 21b. The first region 13a, the second region 13b, and the third region 13c are arranged in the direction of the second axis Ax2. The second region 13b is located between the first end surface 21a and the third region 13c. The semiconductor mesa 19 includes a third mesa portion 19c in addition to the first mesa portion 19a and the second mesa portion 19b. The first mesa portion 19a, the second mesa portion 19b, and the third mesa portion 19c are arranged in the direction of the second axis Ax2. The second mesa portion 19b is located between the first mesa portion 19a and the third mesa portion 19c.

Referring again to FIG. 1, FIG. 2A, FIG. 2B, and FIG. 2C, the conductive semiconductor region 27 includes an upper conductive semiconductor layer 27a and a lower conductive semiconductor layer 27b. The core layer 24 is disposed between the upper conductive semiconductor layer 27a and the lower conductive semiconductor layer 27b, and the core layer 24 is in contact with the upper conductive semiconductor layer 27a and the lower conductive semiconductor layer 27b. In the present embodiment, in the first mesa portion 19a and the second mesa portion 19b, the lower conductive semiconductor layer 27b is disposed between the substrate 17 and the core layer 24 so as to function as a cladding layer.

In the present embodiment, in the first mesa portion 19a, the first superlattice layer 23 and the second superlattice layer 25 are disposed between the upper conductive semiconductor layer 27a and the lower conductive semiconductor layer 27b, and the first superlattice layer 23 and the second superlattice layer 25 are respectively in contact with the lower conductive semiconductor layer 27b and the upper conductive semiconductor layer 27a.

If necessary, the upper conductive semiconductor layer 27a may include a diffraction grating layer 27c having a periodic structure (a period RMD) capable of providing a Bragg wavelength to the quantum cascade laser 11, and in the present embodiment, the diffraction grating layer 27c is in contact with the first superlattice layer 23 in the second mesa portion 19b.

If necessary, the upper conductive semiconductor layer 27a may include a contact layer 27e in addition to an upper cladding layer 27d, and in the present embodiment, the contact layer 27e is located at the top of the laser structure 13 and is in contact with the first electrode 15.

The first mesa portion 19a is located between the first end surface 21a and the second mesa portion 19b. The second mesa portion 19b is located between the second end surface 21b and the first mesa portion 19a. The third mesa portion 19c is located between the second end surface 21b and the second mesa portion 19b.

The quantum cascade laser 11 can have a semiconductor embedded region 28 formed on the main surface 17a of the substrate 17, and the semiconductor mesa 19 is embedded in the semiconductor embedded region 28.

EXAMPLE

The structure of the quantum cascade laser 11 is as follows.

Substrate 17; n-type indium phosphide (InP) semiconductor

Upper clad layer 27d and lower clad layer (27b); n-type InP

Figure 4:
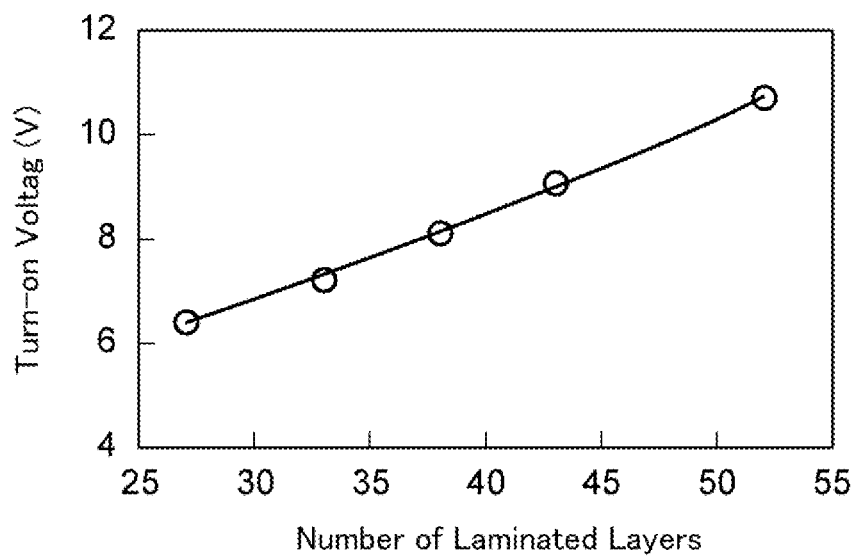
FIG. 4 is a graph illustrating a relationship between the number of laminated layers of unit cells and a turn-on voltage in the quantum cascade laser.

First superlattice layer 23 and second superlattice layer 25 (core layer): GaInAs/AlInAs superlattice layer Diffraction grating layer 27c: n-type GaInAs Contact layer 27e: n-type GaInAs Semiconductor embedded region 28: Fe-doped InP FIG. 4 is a graph illustrating a relationship between the number of laminated layers of unit cells and a turn-on voltage in the quantum cascade laser. The turn-on voltage increases as the number of laminated layers of the unit cells becomes larger. Number of laminated layers of unit cells, turn-on voltage 27, 6.4 volts 38, 8.2 volts 52, 10.8 volts The following are examples of the quantum cascade laser 11.

In a first structure, the first superlattice layer 23 and the second superlattice layer 25 in the first mesa portion 19a include the unit cells (29, 31) having 52 stages in total, and the first superlattice layer 23 in the second mesa portion 19b includes the unit cells (29) having 38 stages in total. In the first structure, since the number of laminated layers of the unit cells in the first mesa portion 19a is larger than the number of laminated layers of the unit cells in the second mesa portion 19b, when the second mesa portion 19b is turned on, the first mesa portion 19a is not turned on, and resistance in the first mesa portion 19a is kept high. As a result, in the first structure, the amount of current that is leaked from the first end surface 21a can be reduced, and thus, deterioration of the end surface due to such current leakage and that is a cause of failure of a quantum cascade laser is effectively suppressed.

In a second structure, the first superlattice layer 23 and the second superlattice layer 25 in the second mesa portion 19b include the unit cells (29, 31) having 38 stages in total, and the first superlattice layer 23 in the first mesa portion 19a includes the unit cells (29) having 27 stages in total. In the second structure, since the number of laminated layers of the unit cells in the second mesa portion 19b is larger than the number of laminated layers of the unit cells in the first mesa portion 19a, when the first mesa portion 19a is turned on, the second mesa portion 19b is not turned on, and the resistance is kept high. In this case, after the first mesa portion 19a has been turned on, a current is selectively injected into the first mesa portion 19a. Thus, the first mesa portion 19a functions as a light-emitting region, and mid-infrared light is generated. In contrast, the second mesa portion 19b is not turned on, and thus, the second mesa portion 19b does not function as a light-emitting region. Instead, the second mesa portion 19b functions as a distributed Bragg reflector (DBR) that selectively reflects only light near the Bragg wavelength of the diffraction grating layer 27c among the mid-infrared light generated by the first mesa portion 19a. Thus, the quantum cascade laser 11 can function as a so-called DBR laser that is capable of oscillating at a single wavelength selected by the DBR.

More specifically, referring to the portions (a) to (i) of FIG. 3, the second superlattice layer 25 is provided in the first mesa portion 19a and reaches the first end surface 21a. On the first end surface 21a, the first superlattice layer 23 is provided between the second superlattice layer 25 and substrate 17. In addition, the second superlattice layer 25 is provided in the third mesa portion 19c and reaches the second end surface 21b. On the second end surface 21b, the first superlattice layer 23 is provided between the second superlattice layer 25 and the substrate 17. The turn-on voltage in a mesa portion that does not include the second superlattice layer 25 is lower than the turn-on voltage in a mesa portion that includes the second superlattice layer 25.

There has been a demand for a reduction in deterioration of end surfaces of quantum cascade lasers. Deterioration of such an end surface relates to deterioration of the crystallinity at the end surface and results in an increase in a threshold current of a quantum cascade laser and/or a decrease in light output. According to the knowledge of the inventor of the present invention, a current leaked through an end surface is a factor responsible for deterioration of the end surface.

In the quantum cascade laser 11, the first superlattice layer 23 and the second superlattice layer 25 reach the first end surface 21a, and the amount of current leakage related to the first end surface 21a is reduced.

Referring to FIG. 1, FIG. 2A, and FIG. 2B, the semiconductor mesa 19 can have a substantially uniform mesa width (W1, W2) in a direction from the second mesa portion 19b toward the first mesa portion 19a. The mesa width (W1, W2) can be set within a range of, for example, 3 micrometers to 10 micrometers.

Alternatively, referring to FIG. 1, FIG. 2A, and FIG. 2C, in the semiconductor mesa 19, the first mesa portion 19a can have a portion (a tapered portion) having a mesa width W1TP that is smaller than the mesa width W2 of the second mesa portion 19b and that decreases in a direction from the second mesa portion 19b toward the first end surface 21a through the mesa portion 19a (W1TP<W2). The mesa width W1TP is set within a range of, for example, 0.5 micrometers to 5 micrometers. The mesa width W2 is set within a range of, for example, 3 micrometers to 10 micrometers. Regarding light that propagates in the first mesa portion 19a toward the first end surface 21a in the quantum cascade laser 11, the distribution range of the light in a plane perpendicular to the axis Ax2 increases as the mesa width W2 decreases. The height of the mesa is, for example, within a range of 7 micrometers to 8 micrometers. The length of the second mesa portion 19b along the axis Ax2 is, for example, within a range of 1 millimeter to 3 millimeters. The length of the first mesa portion 19a along the axis Ax2 is, for example, within a range of 150 micrometers to 300 micrometers.

Figure 5:
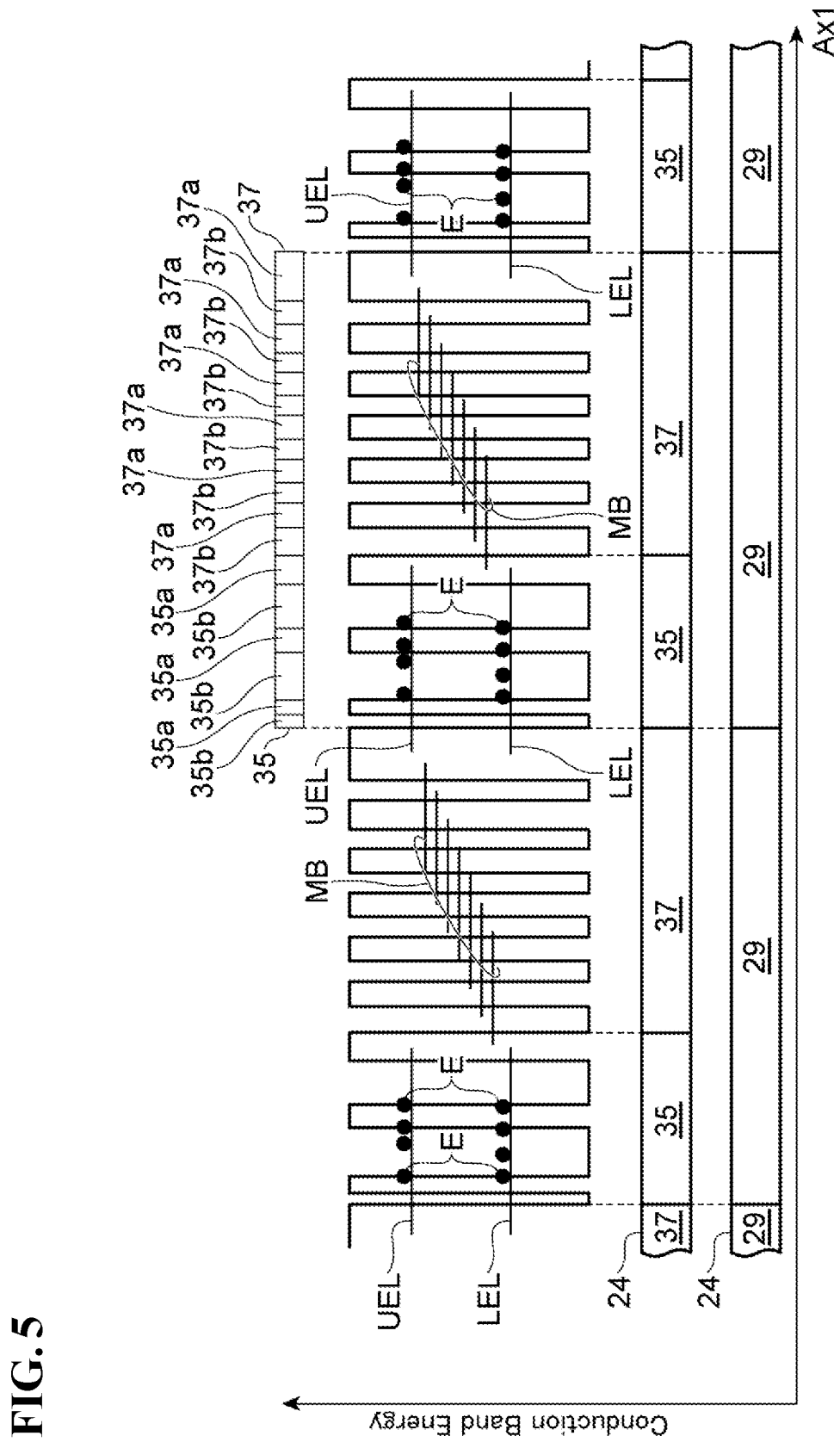
FIG. 5 is a diagram schematically illustrating a band structure of a conduction band of a core layer included in the quantum cascade laser that receives a voltage smaller than the turn-on voltage corresponding to the number of the laminated layers of the unit cells.
Figure 6:
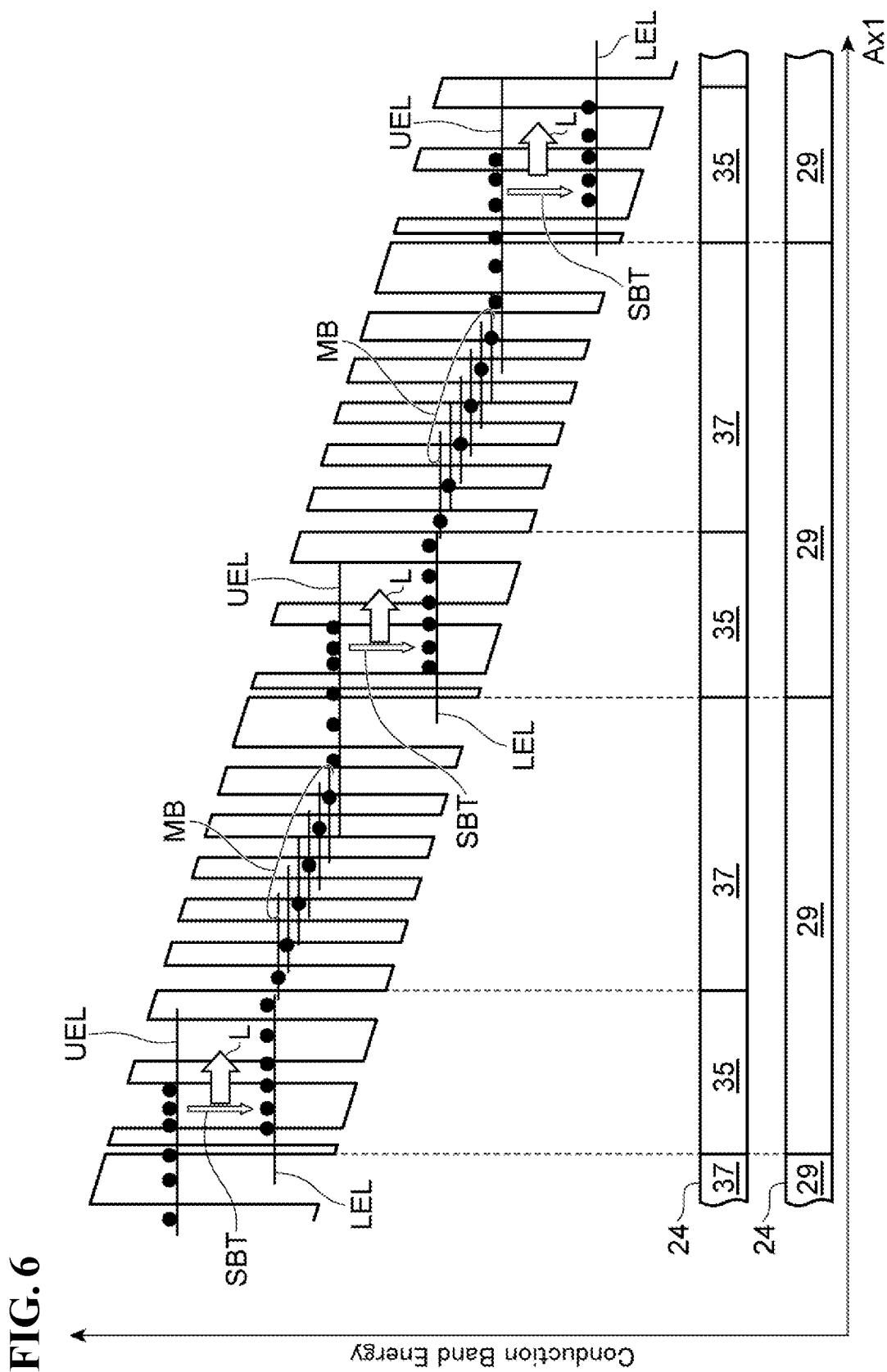
FIG. 6 is a diagram schematically illustrating a band structure of a conduction band of a core layer included in the quantum cascade laser that receives a voltage larger than the turn-on voltage corresponding to the number of the laminated layers of the unit cells.

FIG. 5 is a diagram schematically illustrating a band structure of a conduction band of a core layer included in the quantum cascade laser that receives a voltage smaller than the turn-on voltage corresponding to the number of the laminated layers of the unit cells. FIG. 6 is a diagram schematically illustrating a band structure of a conduction band of a core layer included in the quantum cascade laser that receives a voltage larger than or equal to the turn-on voltage corresponding to the number of the laminated layers of the unit cells.

With reference to FIG. 5 and FIG. 6, the structure of the core layer 24 that includes a superlattice structure of the quantum cascade laser will be described. Although the following description refers to the unit cells 29, the same description applies to the unit cells 31. The first superlattice layer 23 includes the plurality of unit cells 29. Each of the unit cells 29 includes, for example, an active layer 35 that provides subbands including a subband at an upper level UEL and a subband at a lower level LEL. The unit cell 29 also includes an injection layer 37 that provides a miniband MB serving as a path for injecting a carrier into the active layer 35. The miniband MB is formed of a large number of subbands crowded together. The first superlattice layer 23 includes the active layers 35 and the injection layers 37 that are alternately arranged. Each of the active layers 35 includes an array including barrier layers 35a and well layers 35b that are arranged so as to provide the subbands UEL, LEL. Each of the injection layers 37 includes an array including barrier layers 37a and well layers 37b that are arranged so as to provide the miniband MB. In the quantum cascade laser 11, the first superlattice layer 23 and the second superlattice layer 25 may use the unit cells 29 and 31 that are substantially the same as each other.

As illustrated in FIG. 5, in the quantum cascade laser 11 that receives a voltage smaller than the turn-on voltage corresponding to the number of the laminated layers of the unit cells (29, 31), each subband level in the miniband MB of each of the injection layers 37 is higher than the subband lower level LEL of each of the active layers 35 in terms of energy. Thus, it is difficult for electrons to transfer from the subband at the lower level LEL toward the injection layer 37. In other words, the injection layer 37 functions as a high-resistance layer for electrons from the active layer 35. As a result, only a small amount of current flows in the core layer 24. As the electrons E on the subband at the upper level UEL of the active layers 35 cannot make a transition to the subband at the lower level LEL, an intersubband transition SBT does not occur.

As illustrated in FIG. 6, in the quantum cascade laser 11 that receives a voltage larger than the turn-on voltage corresponding to the number of the laminated layers of the unit cells (29, 31), the subbands in the miniband MB of each of the injection layers 37 are shifted to a lower energy level with respect to the subband at the lower level LEL in the active layers 35. In addition, in the miniband MB, the subbands are arranged such that the energy level monotonically decreases with increasing distance from the active layer 35. In addition, a subband structure of a conduction band is constructed such that the subband at the lowest energy level of the miniband MB formed at the right-hand end of the injection layers 37 has an energy level equal to the upper level UEL of the subband of one of the active layers 35 of one of the unit cells (29, 31) that is adjacent thereto on a low-energy side. In this subband structure, first, in one of the unit cells (29, 31) that is adjacent to the upper cladding layer 27d and that is on the highest energy side, light L of mid-infrared photon energy corresponding to the energy difference between these levels is generated as a result of intersubband transition of the electrons E from the subband at the upper level UEL to the subband at the lower level LEL of the active layer 35. After that, the electrons E are injected into the miniband MB of the injection layer 37 from the subband at the lower level LEL, and in the miniband MB, as described above, the subbands are arranged in descending order of their energy levels, and thus, the electrons E can move smoothly in the miniband MB from a high energy level subband to a low energy level subband and eventually reach the lowest-energy subband at the right-hand end of the injection layer 37. As described above, the lowest-energy subband is at an energy level equal to the upper level UEL of the subband of one of the active layers 35 of the next unit cell (29, 31) on the low energy side. Thus, the electrons E are also smoothly injected into the next unit cell (29, 31) and move in the subsequent unit cells (29, 31) such that generation of mid-infrared light repeatedly occurs as a result of similar intersubband transitions. After that, the electrons E can eventually be discharged to the side on which the lower cladding layer 27b is present. In other words, after turning on, the resistance of the core region with respect to the electrons E decreases, and a current can be injected into the core region, so that mid-infrared light is generated. The mid-infrared light generated in this manner is amplified inside a resonator of the semiconductor mesa 19, which in turn results in laser oscillation.

The difference between the number of laminated layers of the unit cells 29 and 31 and the number of laminated layers of the unit cells 29 results in a difference between the current density in the first mesa portion 19a and the current density in the second mesa portion 19b in the semiconductor mesa 19 of the quantum cascade laser 11. As the first mesa portion 19a is not turned on, the current density in each of the arrays of the unit cells (29, 31) is substantially zero.

The following are examples of the unit cells (29, 31).
Active layer 35: AlInAs/GaInAs superlattice
Injection layer 37: AlInAs/GaInAs superlattice different from active layer 35
Laser oscillation wavelength: 4 to 15

In the quantum cascade laser 11, the subband structures of the active layers 35 and the miniband structures of the injection layers 37 are each provided by an AlInAs/GaInAs superlattice.

Referring to the portion (a), the portion (b), the portion (d), the portion (f), and the portion (h) of FIG. 3, the first electrode 15 and the second electrode 33 reach the first end surface 21a. The second superlattice layer 25 is provided in the first mesa portion 19a and the third mesa portion 19c and reaches the first end surface 21a (second end surface 21b). In the first mesa portion 19a and the third mesa portion 19c, the first superlattice layer 23 is provided between the second superlattice layer 25 and the lower conductive semiconductor layer 27b. A diffraction grating of the diffraction grating layer 27c reaches the second superlattice layer 25 and is terminated at the second superlattice layer 25.

Referring to the portion (a), the portion (c), the portion (e), the portion (g), and the portion (i) of FIG. 3, at least one of the first electrode 15 and the second electrode 33 include an end portion that is set back (is spaced apart) from the first end surface 21a (second end surface 21b). Both the first electrode 15 and the second electrode 33 can be set back from the first end surface 21a (second end surface 21b). Alternatively, the first electrode 15 can be set back from the first end surface 21a (second end surface 21b), and the second electrode 33 can reach the first end surface 21a (second end surface 21b). Alternatively, the second electrode 33 can be set back from the first end surface 21a (second end surface 21b), and the first electrode 15 can reach the first end surface 21a (second end surface 21b). By setting back the first electrode 15, the current density in the vicinity of the first end surface 21a (second end surface 21b) is reduced. By setting back the second electrode 33, the current density in the vicinity of the first end surface 21a (second end surface 21b) is reduced.

The second superlattice layer 25 is provided in the first mesa portion 19a and the third mesa portion 19c and reaches the first end surface 21a (second end surface 21b). In the first mesa portion 19a and the third mesa portion 19c, the first superlattice layer 23 is provided between the second superlattice layer 25 and the lower conductive semiconductor layer 27b. The second superlattice layer 25 is provided between the first superlattice layer 23 and the upper clad layer 27d. The diffraction grating of the diffraction grating layer 27c reaches the second superlattice layer 25 and is terminated at the second superlattice layer 25.

Referring to the portion (a), the portion (b), the portion (c), the portion (f), and the portion (g) of FIG. 3, the first superlattice layer 23 and the second superlattice layer 25 are arranged so as to be in contact with each other in the direction of the first axis Ax1. As a result of the first superlattice layer 23 and the second superlattice layer 25 being in contact with each other, the first superlattice layer 23 and the second superlattice layer 25 can be grown in a continuous manner. The diffraction grating layer 27c reaches the second superlattice layer 25 and is terminated at the second superlattice layer 25.

Referring to the portion (a), the portion (d), the portion (e), the portion (h), and the portion (i) of FIG. 3, the first superlattice layer 23 is spaced apart from the second superlattice layer 25 in the direction of the first axis Ax1. In the quantum cascade laser 11, as a result of the first superlattice layer 23 and the second superlattice layer 25 being spaced apart from each other, continuous growth of the first superlattice layer 23 and the second superlattice layer 25 is avoided, and the number of the laminated layers of the unit cells can be avoided from being determined by the amount of etching performed in a manufacturing process. The diffraction grating layer 27c reaches the second superlattice layer 25 and is terminated at the second superlattice layer 25.

More specifically, an array of lower unit cells (GaInAs/AlInAs) for the first superlattice layer 23 is formed, and a semiconductor thin film (an intermediate layer 26) is grown onto this array of the unit cells. The semiconductor thin film can include, for example, InP without including a superlattice array. An array of upper unit cells (GaInAs/AlInAs) for the second superlattice layer 25 is formed onto this semiconductor thin film. The upper GaInAs/AlInAs is selectively removed by wet etching using photolithography and a phosphoric acid etchant with respect to InP of the intermediate layer 26. In addition, InP is selectively removed by, for example, wet etching using a hydrochloric acid-based etchant with respect to GaInAs/AlInAs. The semiconductor thin film for the intermediate layer 26 can have a thickness within a range of, for example, 10 nm to 50 nm. According to the intermediate layer 26 made of a material different from that of the diffraction grating layer 27c, the diffraction grating layer 27c reaches the second superlattice layer 25 and is terminated at the second superlattice layer 25.

In the quantum cascade laser 11, any one of the structures illustrated in the portions (b) to (e) of FIG. 3 may be combined with any one of the structures illustrated in the portions (f) to (i) of FIG. 3. In addition, the quantum cascade laser 11 does not need to include the third mesa portion 19c and may include the first mesa portion 19a and the second mesa portion 19b.

The semiconductor in the quantum cascade laser 11 will now be specifically described.

The substrate 17 has favorable electrical conductivity and include, for example, an n-type InP wafer. Using an n-type InP wafer facilitates crystal growth of semiconductor layers for a quantum cascade laser that emits mid-infrared light (oscillation wavelength: 3 micrometers to 20 micrometers).

The upper cladding layer 27d and the lower conductive semiconductor layer 27b (lower cladding layer), which are included in the conductive semiconductor region 27, each include an n-type InP.

The first superlattice layer 23 and the second superlattice layer 25 or the first superlattice layer 23 may serve as the core layer 24. The core layer 24 includes laminated layers of unit structures including the active layers 35 and the injection layers 37, which are, for example, laminated layers of several tens of periods. In the core layer 24, the plurality of active layers 35 and the plurality of injection layers 37 are alternately arranged. Both the active layers 35 and the injection layers 37 include superlattice arrays including quantum well layers each having a thickness of a few nanometers and thin-film barrier layers each having a thickness of a few nanometers. Each of the barrier layers has a bandgap larger than that of each of the quantum well layers. The quantum cascade laser 11 generates light by using intersubband transition of monopolar carriers which are, for example, electrons in the conduction band. The active layers 35 provide the subband at the upper level UEL and the subband at the lower level LEL for optical transition of the electrons. In the core layer 24, the active layer 35 on a low-potential side is connected to the active layer 35 on a high-potential side by a corresponding one of the injection layers 37. The injection layer 37 between the adjacent active layers 35 enables the electrons to be supplied to the high-potential active layer 35 in a continuous manner. For example, GaInAs or gallium indium arsenide phosphide (GaInAsP) quantum well layers and AlInAs barrier layers enable mid-infrared oscillation.

The quantum cascade laser 11 may be a Fabry-Perot quantum cascade laser that does not include the diffraction grating layer 27c. Alternatively, the quantum cascade laser 11 may be a distributed-feedback quantum cascade laser that includes the diffraction grating layer 27c. The diffraction grating layer 27c is provided in the quantum cascade laser 11 when necessary, and a distributed-feedback quantum cascade laser capable of operating in a single mode is obtained with the diffraction grating layer 27c. The diffraction grating layer 27c has a structure in which an interface between the upper cladding layer 27d of the upper conductive semiconductor layer 27a and the diffraction grating layer 27c provides a periodic refractive index distribution in the direction of the second axis Ax2. The refractive index distribution structure has the period RMD illustrated in the portion (a) of FIG. 3. The period RMD defines the Bragg wavelength.

The contact layer 27e is provided in the quantum cascade laser 11 when necessary. In the present embodiment, the contact layer 27e is provided between the upper cladding layer 27d and the first electrode 15. The contact layer 27e is made of, for example, GaInAs.

The semiconductor embedded region 28 includes an undoped or semi-insulating semiconductor. The semi-insulating property of the semiconductor can be obtained by, for example, adding a transition metal such as Fe, Ti, Cr, or Co to a host semiconductor. An undoped semiconductor and a semi-insulating host semiconductor each include a III-V compound semiconductor such as InP.

If necessary, the quantum cascade laser 11 may have a light confinement region that includes a confinement layer provided at at least one of a position between the lower cladding layer of the lower conductive semiconductor layer 27b and the first superlattice layer 23 and a position between the upper cladding layer 27d and the first superlattice layer 23 or the second superlattice layer 25. The light confinement region can enhance confinement of waveguide light into the core layer 24. The confinement layer can include, for example, an undoped or n-type GaInAs.

A method for manufacturing the quantum cascade laser 11 will now be schematically described with reference to FIGS. 7A to 7C, FIGS. 8A to 8C, FIGS. 9A to 9C, and FIGS. 10A and 10B. In the following description, the reference signs used in the above description, which refers to FIG. 1 to FIG. 3, will be used where possible. In FIGS. 7A to 7C, FIGS. 8A to 8C, FIGS. 9A to 9C, and FIGS. 10A and 10B, the second axis Ax2 is illustrated so as to indicate the orientation of a product in each manufacturing step.

Figure 7A:
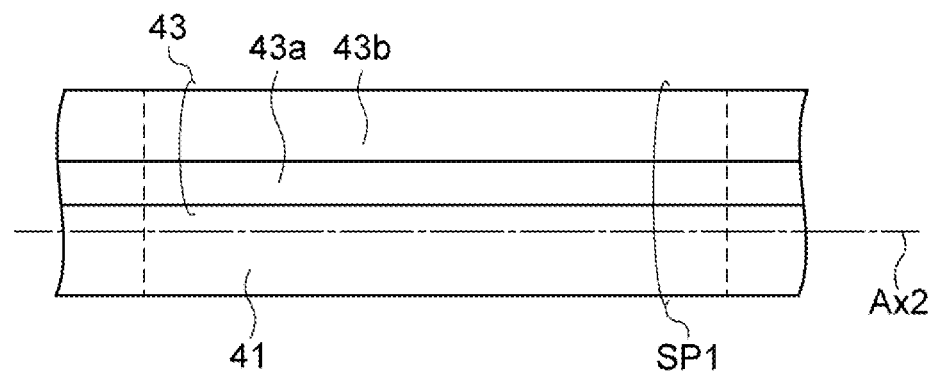
FIGS. 7A to 10B are diagrams schematically illustrating main steps of a method for manufacturing the quantum cascade laser according to the embodiment.

As illustrated in FIG. 7A, a first substrate product SP1 is prepared. The first substrate product SP1 includes a substrate 41 and a semiconductor lamination 43. The semiconductor lamination 43 includes a semiconductor layer 43a for the lower conductive semiconductor layer 27b and a semiconductor layer 43b for the first superlattice layer 23 and the second superlattice layer 25. The semiconductor lamination 43 is grown onto the substrate 41. For example, molecular beam epitaxy or organometallic vapor phase epitaxy is used for growth of a semiconductor.

Figure 7B:
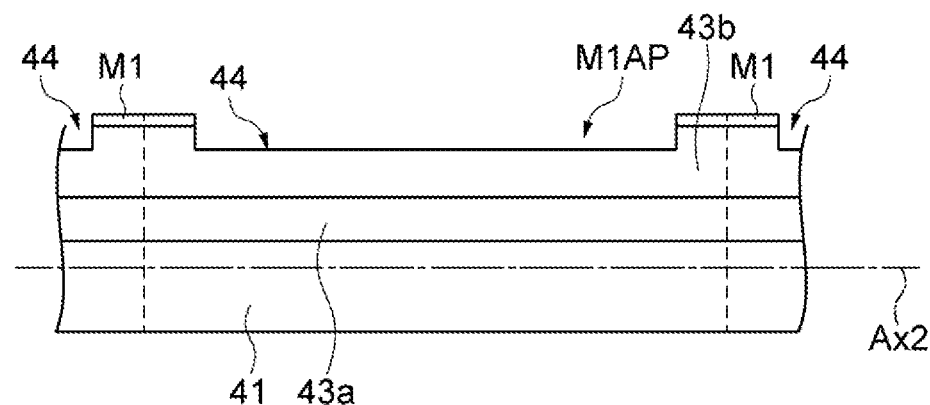

As illustrated in FIG. 7B, a mask M1 is formed onto the first substrate product SP1 by performing deposition of an inorganic film, photolithography, and etching. The mask M1 includes, for example, a silicon-based inorganic insulator. The mask M1 has an opening M1AP in an area in which the diffraction grating layer 27c and the first superlattice layer 23 are to be formed. A recess 44 is formed in the semiconductor layer 43b having a superlattice structure by etching the semiconductor layer 43b using the mask M1. A portion of the semiconductor layer 43b remaining in the recess 44 becomes the first superlattice layer 23, and a portion of the semiconductor layer 43b left without being etched becomes the first superlattice layer 23 and the second superlattice layer 25.

Figure 7C:
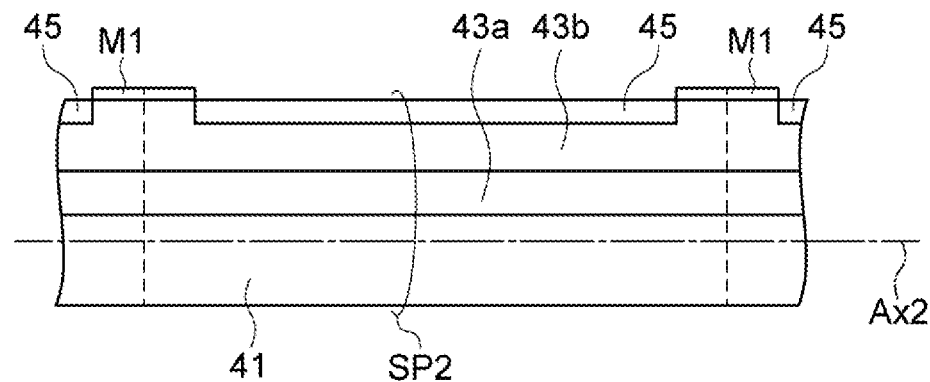

As illustrated in FIG. 7C, a second substrate product SP2 is formed by growing, using the mask M1, a semiconductor layer 45 for the diffraction grating layer 27c.

Figure 8A:
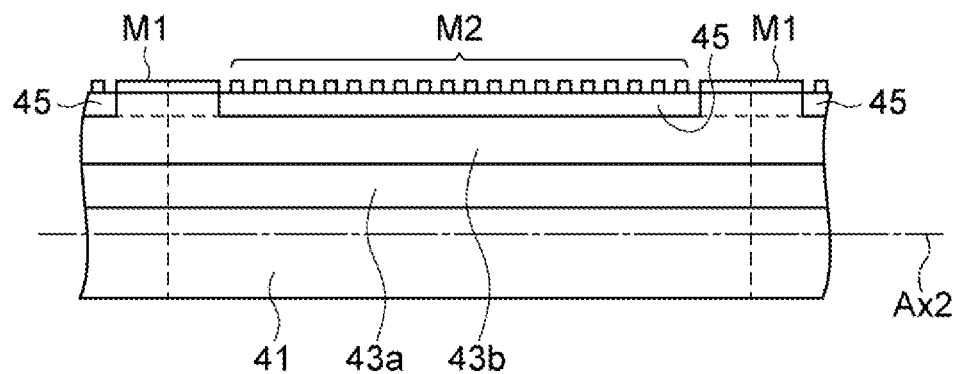

As illustrated in FIG. 8A, after the above growth, a mask M2 that defines a pattern of the diffraction grating layer 27c is formed onto the second substrate product SP2, particularly the semiconductor layer 45, while leaving the mask M1.

Figure 8B:
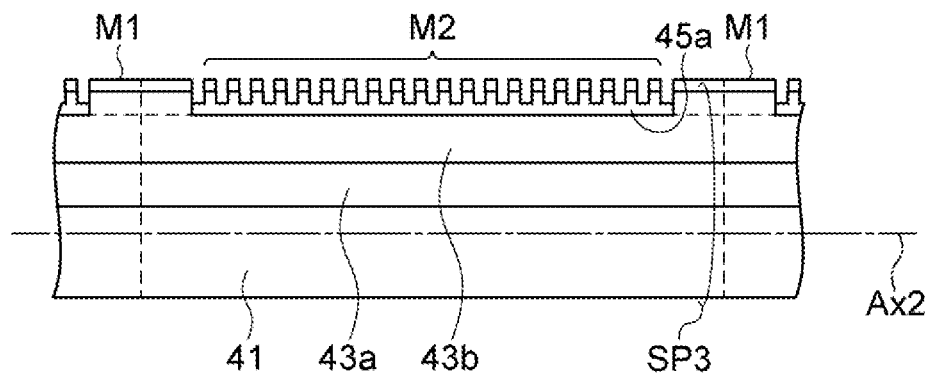

As illustrated in FIG. 8B, a semiconductor layer 45a having the periodic structure of the diffraction grating layer 27c is formed by etching the semiconductor layer 45 using the mask M1 and the mask M2. After the diffraction grating layer 27c has been formed, the masks M1 and M2 are removed by using a buffered hydrofluoric acid, so that a third substrate product SP3 is obtained.

Figure 8C:
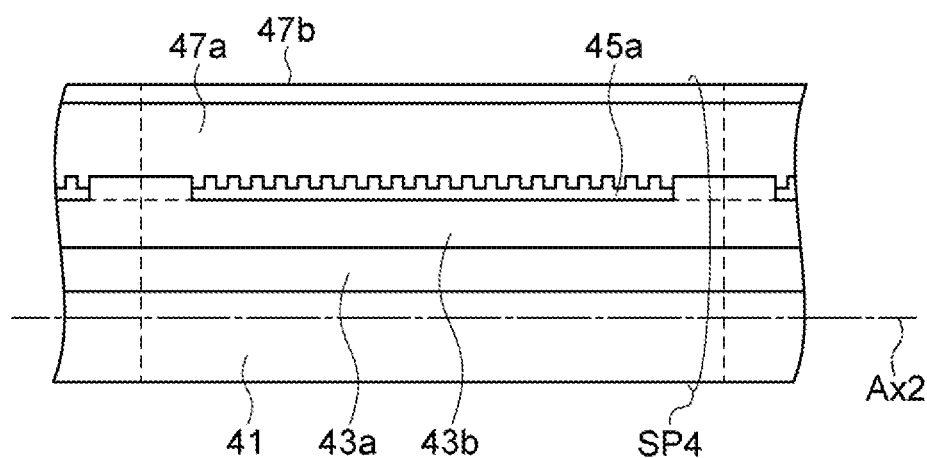

As illustrated in FIG. 8C, a semiconductor layer 47a for the upper cladding layer 27d and a semiconductor layer 47b for the contact layer 27e are grown onto the third substrate product SP3, so that a fourth substrate product SP4 is obtained.

Figure 9A:
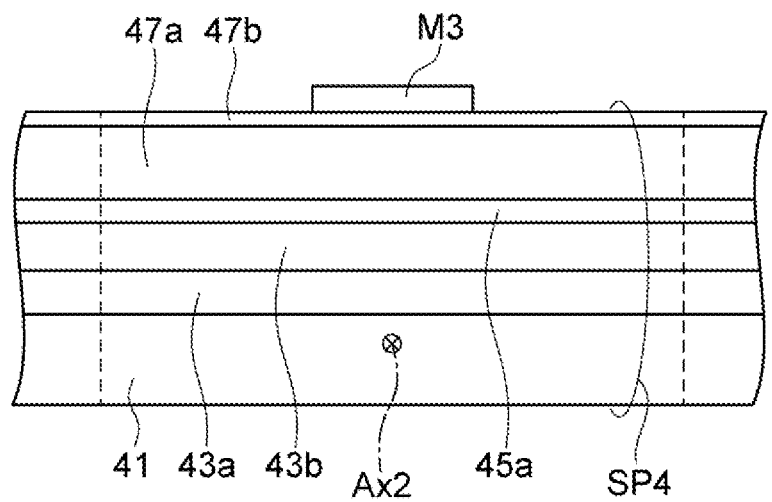

As illustrated in FIG. 9A, a mask M3 formed of an inorganic film is formed onto the fourth substrate product SP4. The mask M3 includes, for example, a silicon-based inorganic insulator. The mask M3 has a stripe shape and defines a pattern of the semiconductor mesa 19.

Figure 9B:
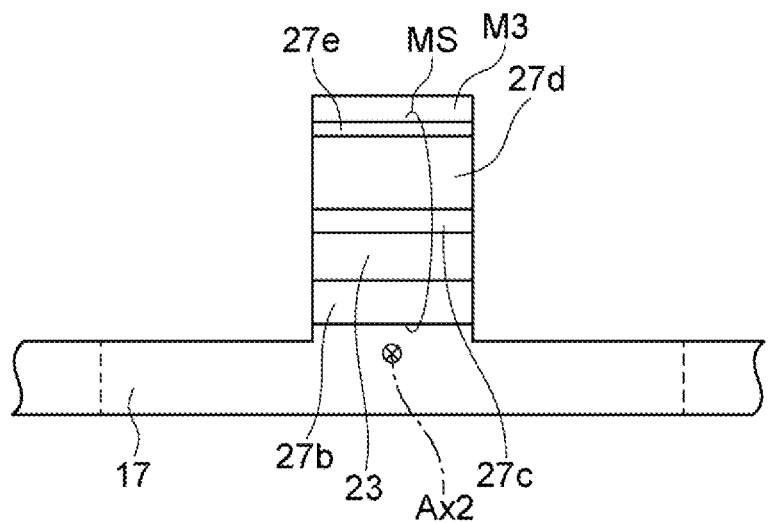

As illustrated in FIG. 9B, a striped semiconductor region MS for the semiconductor mesa 19 is formed by etching the fourth substrate product SP4 using the mask M3.

Figure 9C:
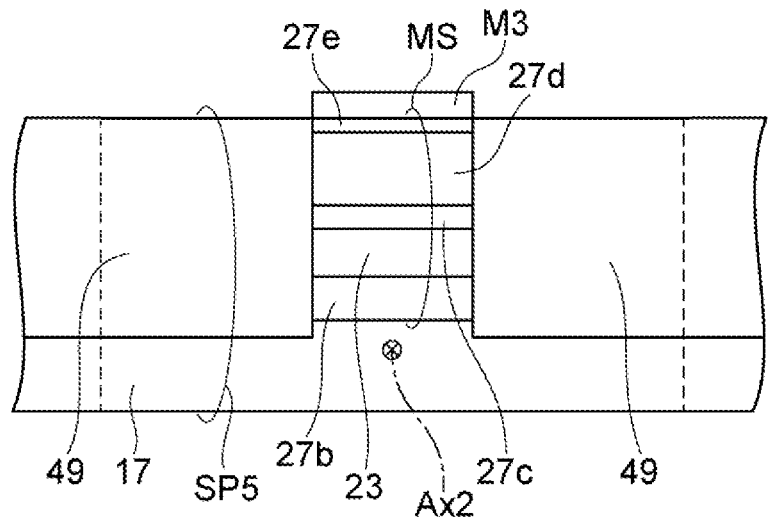

As illustrated in FIG. 9C, a semi-insulating semiconductor layer 49 for the semiconductor embedded region 28 is grown without removing the mask M3 such that the striped semiconductor region MS is embedded in the semi-insulating semiconductor layer 49, so that a fifth substrate product SP5 is formed.

Figure 10A:
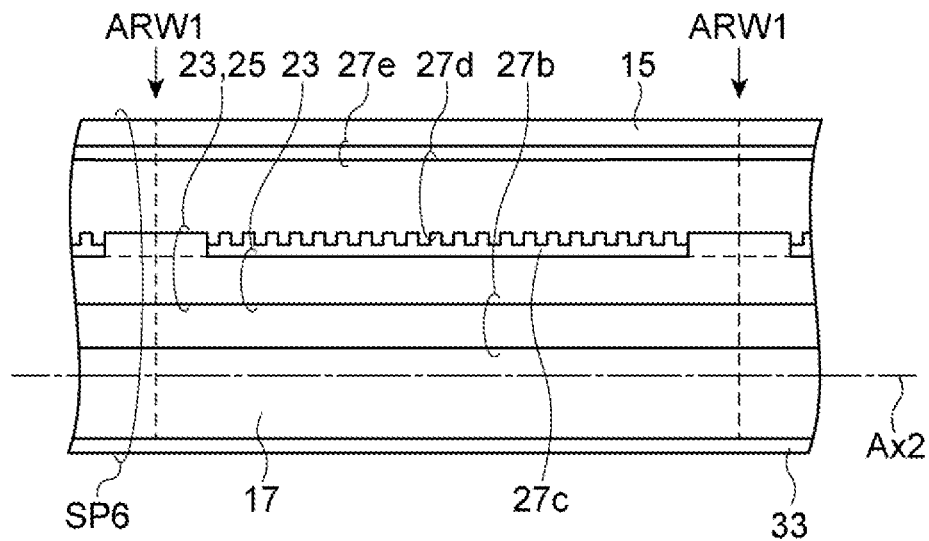
Figure 10B:
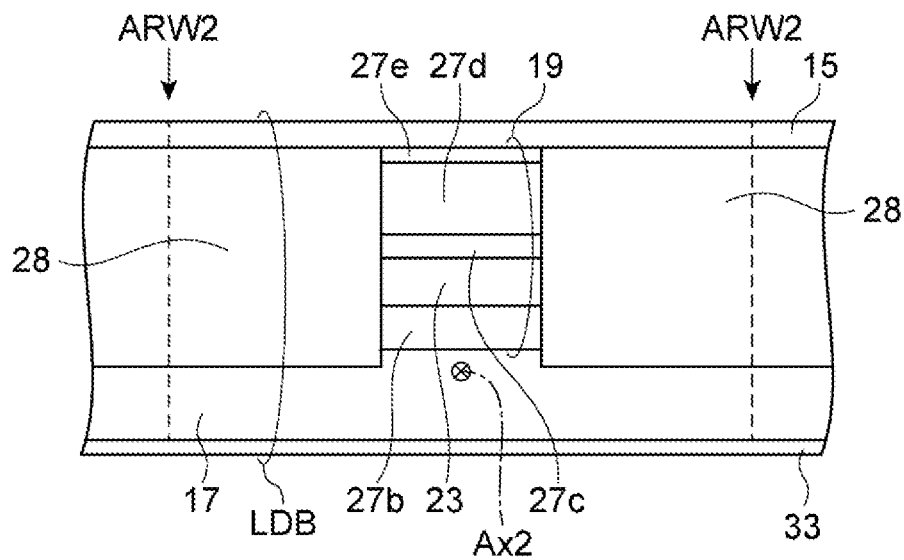

As illustrated in FIG. 10A and FIG. 10B, the first electrode 15 and the second electrode 33 are formed onto the fifth substrate product SP5, so that a sixth substrate product SP6 for the quantum cascade laser 11 is formed. The sixth substrate product SP6 is divided into pieces at positions indicated by arrows ARW1 so as to obtain a laser bar LDB for the quantum cascade laser 11. If necessary, a reflective film can be formed at an end surface of the laser bar LDB.

As illustrated in FIG. 10B, the laser bar LDB is divided into pieces at positions indicated by arrows ARW2 so as to obtain a semiconductor chip for the quantum cascade laser 11.

Manufacture of the quantum cascade laser 11 is completed through the above-described steps. The quantum cascade laser 11 (11b to 11i) is formed in accordance with the pattern of the mask M1, a dividing position, and the design of an electrode pattern.

Although the principle of the present invention in a preferred embodiment has been illustrated and described, it will be appreciated by those skilled in the art that changes may be made to the present invention in terms of arrangement and details without departing from such a principle. The present invention is not limited to the specific configuration described in the above embodiment. Therefore, the inventor claims the rights to all modifications and changes within the scope and spirit of the claims.

What is claimed is:

1. A quantum cascade laser comprising:
   a laser structure that includes a substrate and a semiconductor mesa arranged in a first axis direction and that has a first end surface and a second end surface arranged in a second axis direction crossing in the first axis direction; and
   a first electrode that is provided on the semiconductor mesa,
   wherein the laser structure includes a first region that includes the first end surface and a second region that is located between the second end surface and the first region,
   wherein the semiconductor mesa includes a first mesa portion and a second mesa portion that are respectively included in the first region and the second region,
   wherein the semiconductor mesa includes a first superlattice layer, a second superlattice layer, and a conductive semiconductor region,
   wherein the first superlattice layer extends from the first end surface in the second axis direction and is included in the first mesa portion and the second mesa portion, and the second superlattice layer is provided in one of the first mesa portion and the second mesa portion, and
   wherein the first superlattice layer includes an array of unit cells that provides a subband, and the second superlattice layer includes an array of unit cells that provides a subband.

2. The quantum cascade laser according to claim 1, wherein the second superlattice layer is provided in the first mesa portion and reaches the first end surface.

3. The quantum cascade laser according to claim 1, wherein the first electrode includes an end portion that is spaced apart from the first end surface.

4. The quantum cascade laser according to claim 1, further comprising:
   a second electrode that is connected to the substrate of the laser structure,
   wherein the second electrode includes an end portion that is spaced apart from the first end surface.

5. The quantum cascade laser according to claim 1, wherein the first superlattice layer and the second superlattice layer are arranged so as to be in contact with each other in the first axis direction.

6. The quantum cascade laser according to claim 1, wherein the first superlattice layer is spaced apart from the second superlattice layer in the first axis direction.

7. The quantum cascade laser according to claim 1, wherein, in the semiconductor mesa, the first mesa portion has a mesa width that decreases in a direction from the second mesa portion toward the first end surface.

8. The quantum cascade laser according to claim 1, wherein the unit cells of the first superlattice layer include an active layer that enables intersubband transition and an injection layer that injects a carrier into the active layer, and
   wherein the unit cells of the second superlattice layer are substantially the same as the unit cells of the first superlattice layer.

9. The quantum cascade laser according to claim 1, wherein the unit cells of the first superlattice layer include an active layer having an aluminum indium arsenide (AlInAs)/gallium indium arsenide (GaInAs) superlattice and an injection layer having an AlInAs/GaInAs superlattice, and
   wherein the unit cells of the second superlattice layer include an active layer having an AlInAs/GaInAs superlattice and an injection layer having an AlInAs/GaInAs superlattice.

* * * * *